(12) United States Patent
Hwang

(10) Patent No.: US 6,526,651 B1
(45) Date of Patent: Mar. 4, 2003

(54) PRINTED CIRCUIT BOARD TRANSFERRING APPARATUS OF A SURFACE MOUNTER

(75) Inventor: Ji Hyun Hwang, Kyungki-do (KR)

(73) Assignee: Mirae Corporation, Ichon-shi (JP)

( * ) Notice: Subject to any disclaimer, the term of this patent is extended or adjusted under 35 U.S.C. 154(b) by 312 days.

(21) Appl. No.: 09/586,796

(22) Filed: Jun. 5, 2000

(30) Foreign Application Priority Data

Aug. 20, 1999 (KR) .............................................. 99-34684

(51) Int. Cl.$^7$ ................................................ B23P 19/00
(52) U.S. Cl. .......................................... 29/740; 29/743
(58) Field of Search .......................... 29/739, 740, 743, 29/709, 832, 593, 759; 414/752.1

(56) References Cited

U.S. PATENT DOCUMENTS

| | | | | |
|---|---|---|---|---|
| 4,573,262 A | * | 3/1986 | Domes et al. ................. | 29/739 |
| 4,657,470 A | * | 4/1987 | Clarke et al. ................. | 29/743 |
| 4,905,370 A | * | 3/1990 | Hineno et al. ................ | 29/740 |
| 5,084,959 A | * | 2/1992 | Ando et al. .................... | 29/740 |
| 5,105,368 A | * | 4/1992 | Alexandersen et al. ...... | 700/254 |
| 5,172,468 A | * | 12/1992 | Tanaka et al. ................ | 29/721 |
| 5,495,661 A | * | 3/1996 | Gromer et al. ................ | 29/740 |
| 5,575,059 A | * | 11/1996 | Muraoka et al. | |
| 5,681,757 A | * | 10/1997 | Hayes | |
| 5,694,219 A | * | 12/1997 | Kim ............................ | 29/759 |
| 5,743,005 A | * | 4/1998 | Nakao et al. ................. | 29/740 |
| 5,768,759 A | * | 6/1998 | Hudson | |
| 5,768,765 A | * | 6/1998 | Fujioka et al. ................ | 29/740 |
| 5,855,059 A | * | 1/1999 | Togami et al. ................ | 29/740 |
| 5,860,208 A | * | 1/1999 | Nomura | |
| 5,878,484 A | * | 3/1999 | Araya et al. .................. | 29/743 |
| 6,000,123 A | * | 12/1999 | Munezane et al. ............ | 29/740 |
| 6,045,653 A | * | 4/2000 | Johnson ........................ | 156/292 |
| 6,098,274 A | * | 8/2000 | Raiteri ......................... | 29/739 |
| 6,148,511 A | * | 11/2000 | Taguchi ........................ | 29/739 |
| 6,230,067 B1 | * | 5/2001 | White | |
| 6,266,873 B1 | * | 7/2001 | Kitamura et al. ............. | 29/832 |
| 6,332,269 B1 | * | 12/2001 | Gamel et al. | |
| 6,347,442 B1 | * | 2/2002 | Hwang | |
| 6,374,484 B1 | * | 4/2002 | Yoshida et al. ............... | 29/740 |
| 6,422,801 B1 | * | 7/2002 | Solomon | |
| 2002/0042987 A1 | * | 4/2002 | Oyama | |

FOREIGN PATENT DOCUMENTS

JP 6-152194 * 5/1994

OTHER PUBLICATIONS

US Patent Application Publication, Pub. No. 2002/0047355 A1, Hwang et al., Pub. date: Apr. 25, 2002, entire document.*

US Patent Application Publication, Pub. No. 2002/0062555 A1, Hwang et al., Pub. date: May 30, 2002, entire document.*

* cited by examiner

*Primary Examiner*—Gregory L. Huson
*Assistant Examiner*—Khoa Huynh
(74) *Attorney, Agent, or Firm*—Fleshner & Kim, LLP

(57) ABSTRACT

There is disclosed a printed circuit transferring apparatus of a surface mounter, enabling to accurately control the positions where the electronic components are to be mounted on the printed circuit board (PCB), to make it possible the work at arbitrary positions, and to further provide an easy compensation for any errors possibly occurring in mounting the electronic components. The invention provides a PCB transferring apparatus of a surface mounter for mounting various electronic components on a PCB, the apparatus comprising: a frame; an X-Y gantry provided on an upper portion of the frame, the X-Y gantry being moved along the X-Y axes; a base disposed on the frame and placed inside the X-Y gantry; a sensing unit installed on an upper portion of the base, and for sensing the PCB fed from an inlet to determine the position thereof; a PCB transferring unit for freely moving the sensed PCB on the base; and at lease one or more pickup head units installed in the X-Y gantry, and for mounting the electronic components on the PCB having been transferred by the PCB transferring unit.

19 Claims, 7 Drawing Sheets

PRINTED CIRCUIT BOARD TRANSFERRING APPARATUS OF A SURFACE MOUNTER

BACKGROUND OF THE INVENTION

1. Field of the Invention

The present invention relates to a printed circuit transferring apparatus of a surface mounter, and more particularly to a printed circuit transferring apparatus of a surface mounter, enabling to accurately control the positions where the electronic components are to be mounted on a printed circuit board, to make it possible the work at arbitrary positions, and to further provide an easy compensation for any errors possibly occurring in mounting the electronic components.

Further, the present invention relates to a printed circuit transferring apparatus of a surface mounter for mounting various chips as well as surface mounting components on the printed circuit board.

2. Description of the Conventional Art

In developing recent electronic products, there are trends toward their higher density, smaller size and a variety of electronic components, which developments are becoming highly competitive.

In particular, a surface mounting technology is applied to a printed circuit board (PCB) used for mounting the electric and electronic components thereon by a surface mounting apparatus. The use of such a technology is becoming popular.

A surface mounting assembly equipment typically has the surface mounting apparatus as a core apparatus for mounting the surface mounting components on the PCB. The surface mounting apparatus receives the various types of surface mounting components from a part feeder, transfers the components to the component mounting positions, and then performs the mounting of the components on the PCB.

The surface mounting apparatus is greatly classified into two types of apparatuses, i.e., high speed apparatus and general purpose apparatus, depending upon the function thereof. The former one is designed to assemble a great deal of components in a relatively short time period thus resulting in advantageously provision of faster components mounting operation suitable for mass production. However, this type of apparatus has a drawback in the reduced mounting precision. The latter one is adapted to mount various types of components thus resulting in the provision of higher mounting precision and the feasibility of the mounting of various components. The general purpose apparatus has an advantage for smaller amount of production of various components, but the drawback is its lower throughput caused by the production in retard.

The surface mounting apparatus consists of a feeder (hereinafter, referred to as 'tape feeder') for supplying components, X-Y gantry for determining the mounting positions, a conveyer for carrying a PCB, a header unit for orderly picking up the components from the tape feeder and mounting the same onto the PCB.

The surface mounting apparatus generally refers to an apparatus adapted to mount electronic components, including various chips, on a PCB, and is also collectively called as a mounter.

The detailed structure of the above mentioned mounter will be described below.

The conventional mounter consists of: a base assembly; a conveyer unit disposed on an upper portion of the base assemble, and for carrying the PCB; a feeder unit for supplying various chips or surface mounting components so that these components can be mounted on the PCB; a mounter head assembly for mounting respective components suppled from the feeder unit on the PCB; a sensing unit for sensing the components and correcting the positions thereof such that various components to be mounted by the mounted head assembly can be accurately mounted; an X-Y gantry unit provided with the sensing unit and the mounter head assembly, and for positioning same using an X-Y table; and the others.

The X-Y gantry unit is structured such that one block is moved to a position designated by a X-Y table to perform the mounting work. Herein, said one block consists of plural general-purpose heads and precision specific-purpose heads and functions in such a manner that the electronic components are centered.

The centering performance for respective electronic components greatly depends on whether what type of feeders is used to supply the components or what type of cameras is employed.

The above-mentioned sensing units are, respectively, disposed on front and rear sites, in consideration of the work efficiency. One sensing unit located in the front site is for sensing the components fed from the feeder positioned at a front feeder base, while the other sensing unit located in the rear site is for sensing the components fed from another feeder positioned at a rear feeder base. These sensing units acquire images of the components to use same at the time mounting the electronic components.

The conveyer unit carries the PCB on which various chips are to be mounted, and functions to transfer the PCB. The transfer of the PCB is made by a conveyer belt installed on the conveyer unit. The mounter head installed in the X-Y gantry is used to mount the chips.

FIG. 1 is a perspective view of a conventional surface mounter, FIG. 2 is a perspective view structurely showing a conventional conveyor for supplying PCBs, and FIG. 3 is a plan view of the conveyor of FIG. 2.

Referring to FIGS. 1, 2 and 3, there are shown a frame assembly 100 for supporting a surface mounter, a base assembly 102 disposed on an upper portion of the frame assembly 100 and acting as a base, and a conveyer system 104 installed on an upper portion of the base assembly 102 and for transferring the PCBs.

Further, on an upstream of the conveyer system 104, there is provided an X-Y gantry unit 106 which is operated to move in right, left, forward, and backward directions in order to mount the electronic components, the X-Y gantry unit 106 being comprised of respective gantry frames 109 for supporting an X- and Y-axes.

The gantry frame 109 thus constructed is provided with a movable mounter head assembly 108 used for mounting the components on the PCB transferred by the conveyer system 104.

The mounter head assembly 108 is further provided with a mounter head 120 having a nozzle 112 sucking the components, and a vision unit 114 for carrying out an inspection so that the components sucked can be mounted at the accurate positions on the PCB. Moreover, the conveyer system 104 is provided with a stopper assembly 110 for stopping the transferring of the PCB when the PCB arrives at the work position, a pusher 116 serving to elevate the PCB, and a magnet 118 disposed on a lower portion of the conveyer system 104 to fix the pusher 116.

Further, the conveyer system 104 transferring the PCB is provided with opposing guides 123, 124 disposed parallel to each other on both sides of the base 128, having upper portions thereof on which rails 126 are formed on which both ends of the PCB are placed to be slidably moved thereon. Between both the guides 123, 124, there is installed a push plate 122 having an upper surface on which the stopper assembly 110 is disposed, and in which plural pushers 116 are installed to elevate upward the PCB stopped by said stopper assembly 110 and have respective lower ends thereof to which magnet 118 are installed for fixing the pushers 116 into the push plate 122.

Also, a guide bar 143 is installed in a transversal direction with respect to the guides 123, 124 installed on both sides of the stopper assembly 110.

Further, ball screws 134 are installed on front and rear portions of the guides 123, 134 in a transversal direction with respect thereto, respectively, and has respective one end portion thereof to which driving motors are, respectively, installed. With activation of the driving motor 130, the ball screws 134 are rotated to push the guides 123, 124. Thereby, a smooth supply of the PCBs can be made by an appropriately spread guides in a case of different PCB in size thereof.

However, the conventional PCB transferring apparatus as described above has drawbacks in that when the PCB is suppled to the conveyer unit, the X-Y gantry needs to be moved right and left so that the X-Y gantry is positioned at a designated position for a operation of the picker installed at the mounter head, and the work can be made only by the completion of such an operation, and in that in a case of different dimension of PCB in a lateral and longitudinal sides thereof, an accurate positioning of such a PCB cannot be achieved.

Further, inaccurate positioning of the PCB carried by the conveyer mostly results in an inclination of PCB by a constant angle, and in this case, productivity is lowered and failed products amounts increase due to wreckage and error occurrence of the components, thus resulting in lowered reliability.

To cope with such problems, it may need an extra calibration work, which becomes, however, a significant cause of increased work load.

SUMMARY OF THE INVENTION

Therefore, it is an object of the present invention to provide a printed circuit transferring apparatus of a surface mounter, enabling to accurately control the positions where the electronic components are to be mounted on the PCB, to make it possible the work at arbitrary positions, and to further provide an easy compensation for any errors possibly occurring in mounting the electronic components.

The above object is accomplished by the present invention providing a printed circuit transferring apparatus of a surface mounter for mounting various electronic components on a printed circuit board, the apparatus comprising: a frame; an X-Y gantry provided on an upper portion of the frame, the X-Y gantry being moved along the X-Y axes; a base disposed on the frame and placed inside the X-Y gantry; a sensing unit installed on an upper portion of the base, and for sensing the PCB fed from an inlet to determine the position thereof; a PCB transferring unit for freely moving the sensed PCB on the base; and at lease one or more pickup head units installed in the X-Y gantry, and for mounting the electronic components on the PCB having been transferred by the PCB transferring unit.

According to the PCB transferring apparatus thus constructed, it enables to accurately control the positions where the electronic components are to be mounted on the PCB, as well as to make it possible the work at arbitrary positions. Further, as for any errors possibly occurring in mounting the electronic components, easy compensation therefor can be made. Also, with two or more degrees of freedom given to the PCB transferring unit, by which an accurate mounting of the electronic components is made possible, reliability of the products can be further improved.

DETAILED DESCRIPTION OF THE INVENTION

A preferred embodiment of the present invention will be described in detail, with reference to the accompanying drawings.

Figure 1:
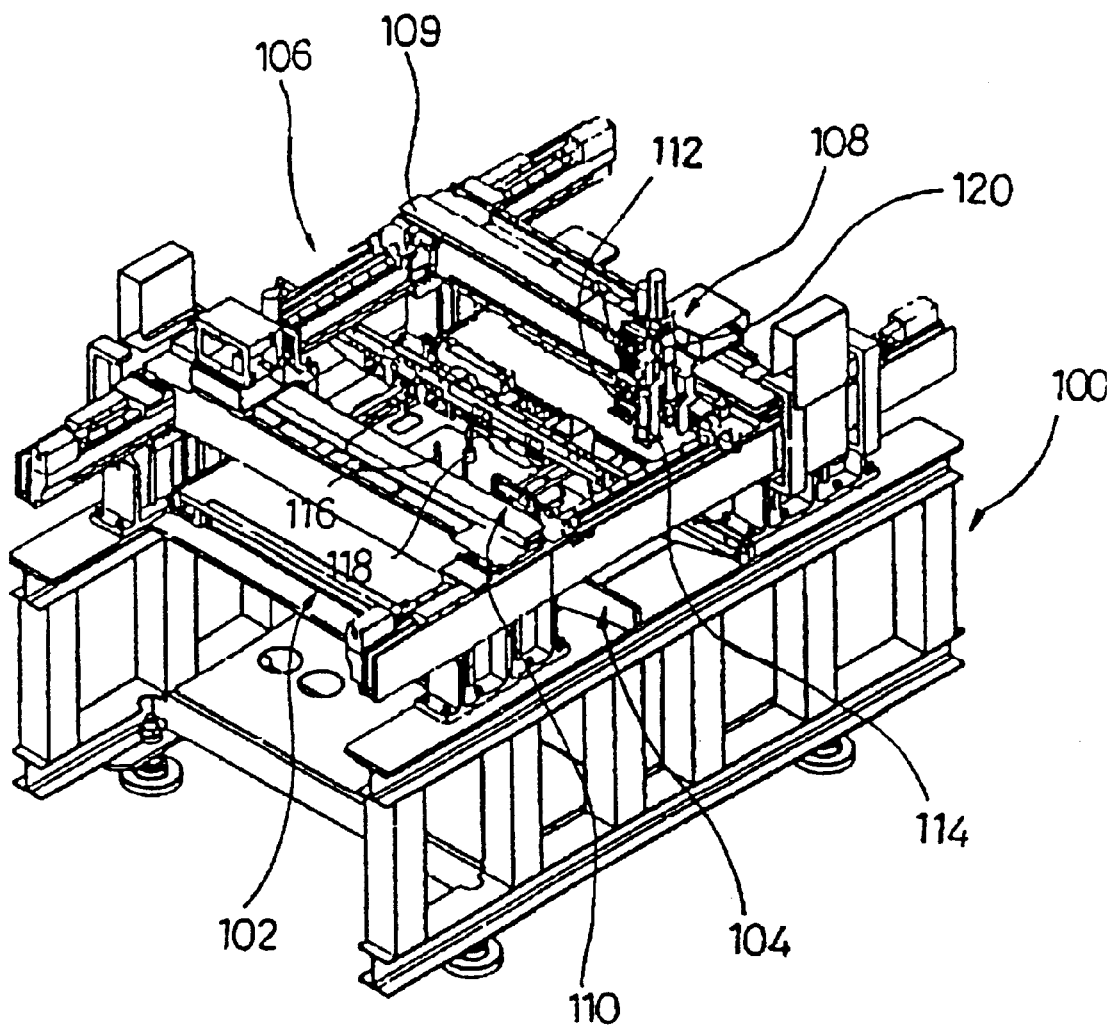
FIG. 1 is a perspective view of a conventional surface mounter.
Figure 2:
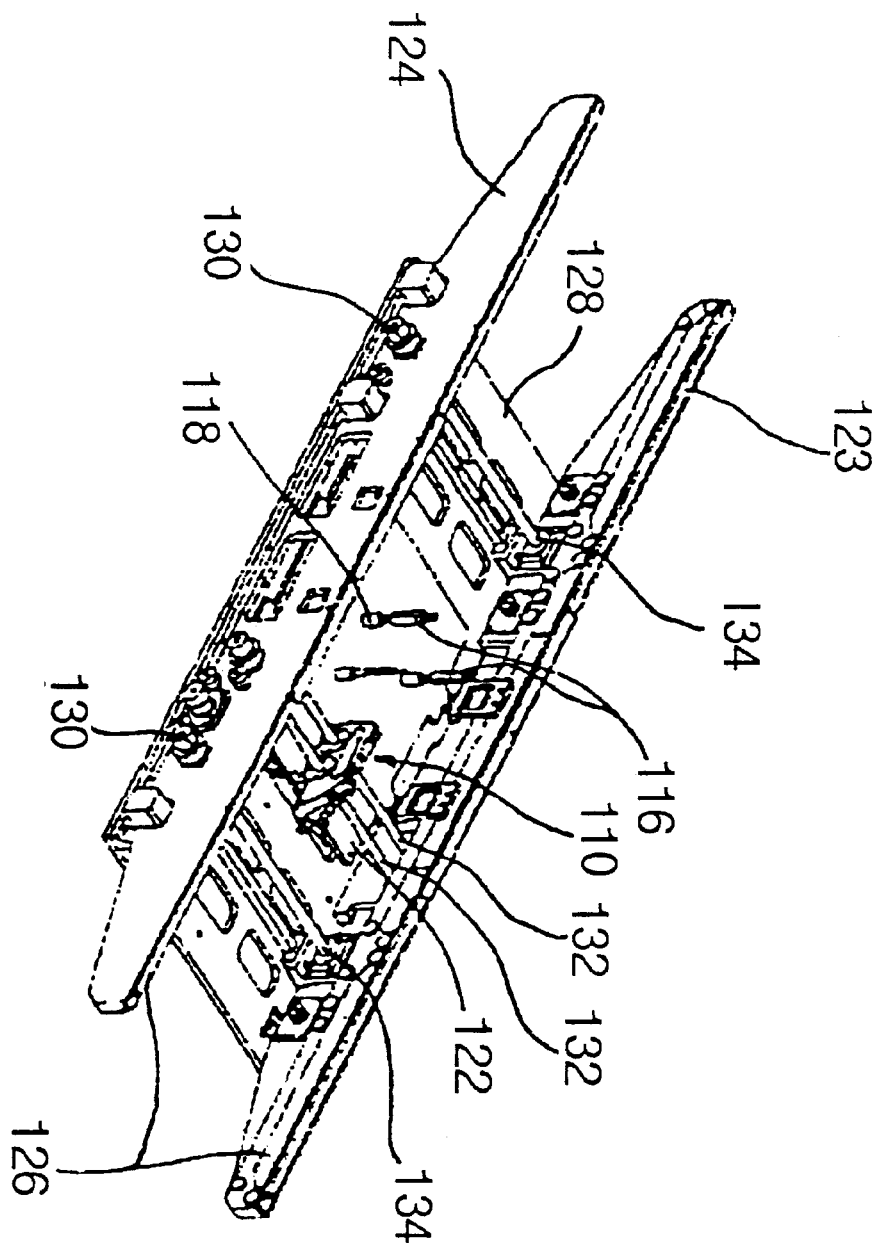
FIG. 2 is a plan view structurely showing a conventional conveyer for supplying PCBs.
Figure 3:
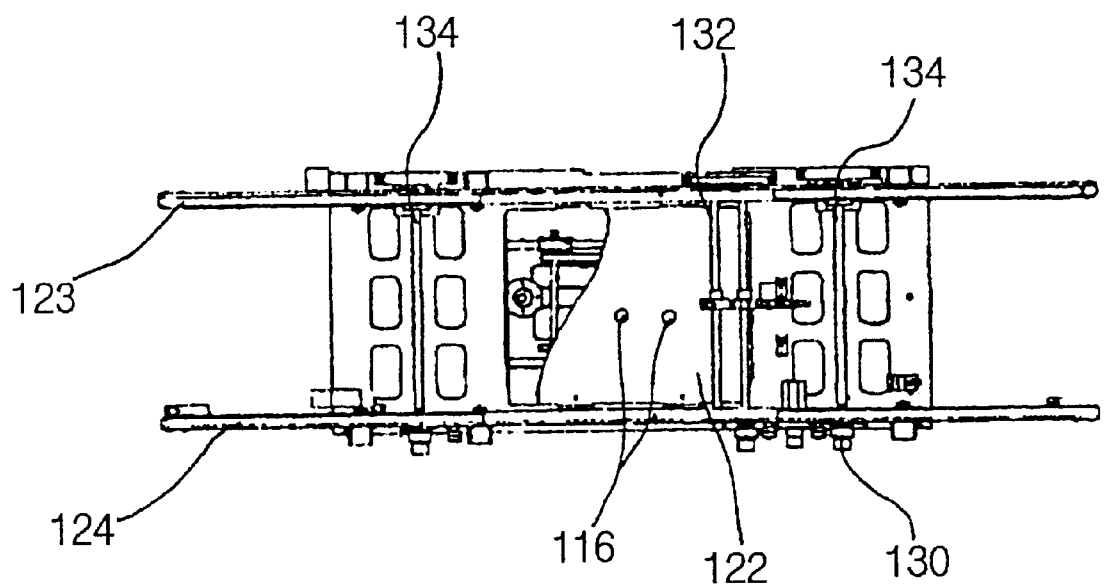
FIG. 3 is a plan view of FIG. 2.
Figure 4:
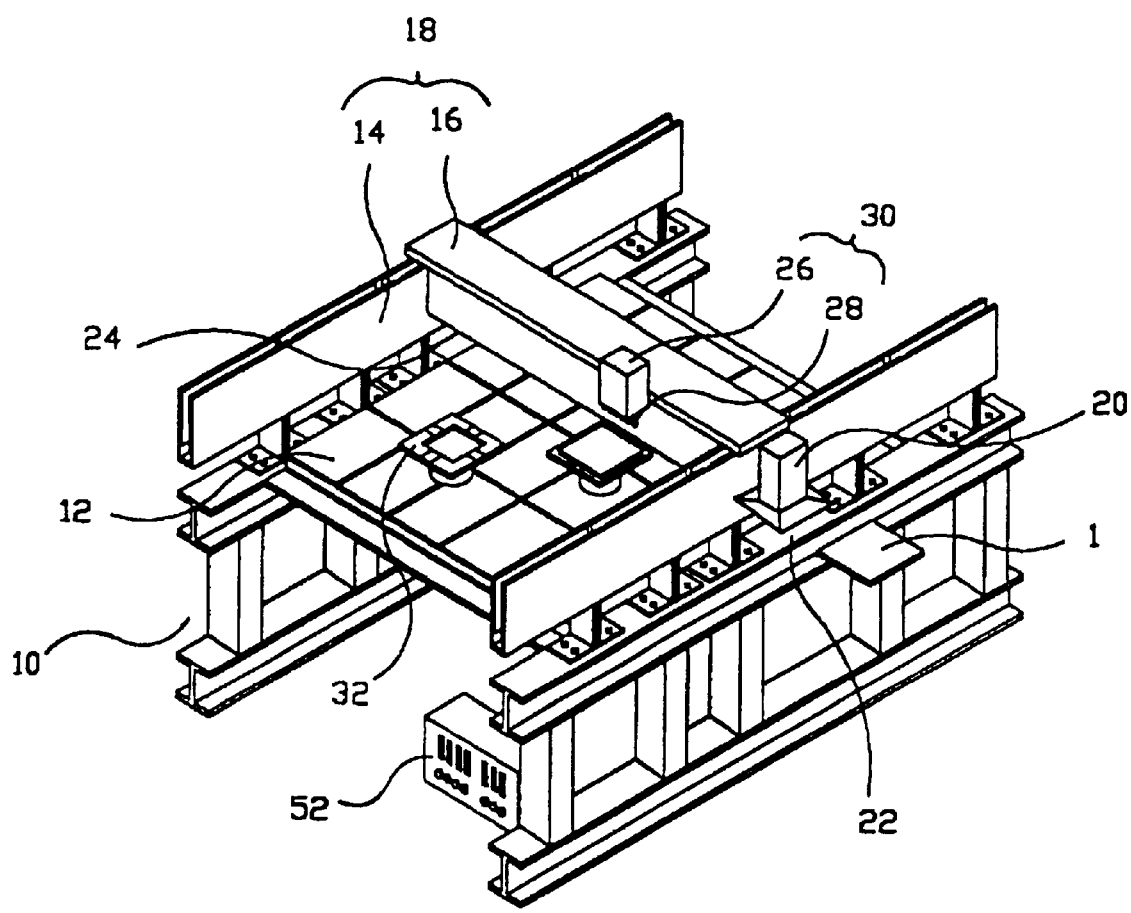
FIG. 4 is a perspective view showing a structure of a surface mounter according to the present invention.
Figure 5:
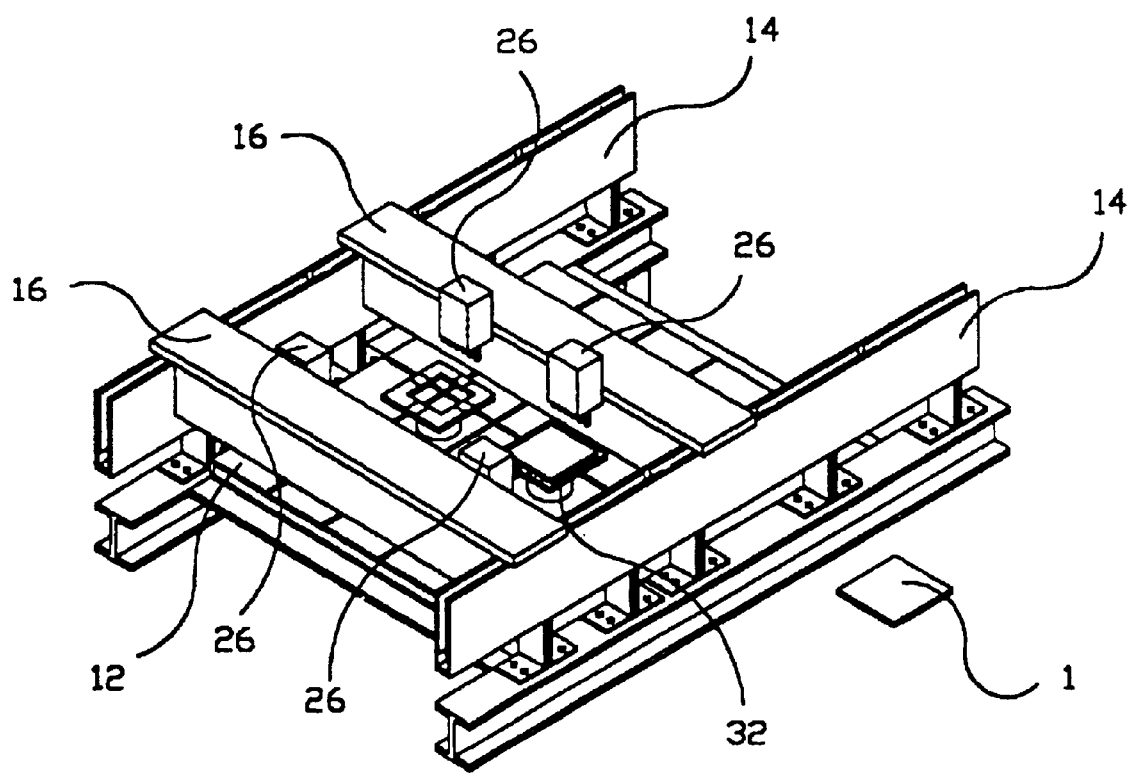
FIG. 5 is a schematical perspective view showing a plurality of transferring units by which PCBs are supplied, and pickers.
Figure 6:
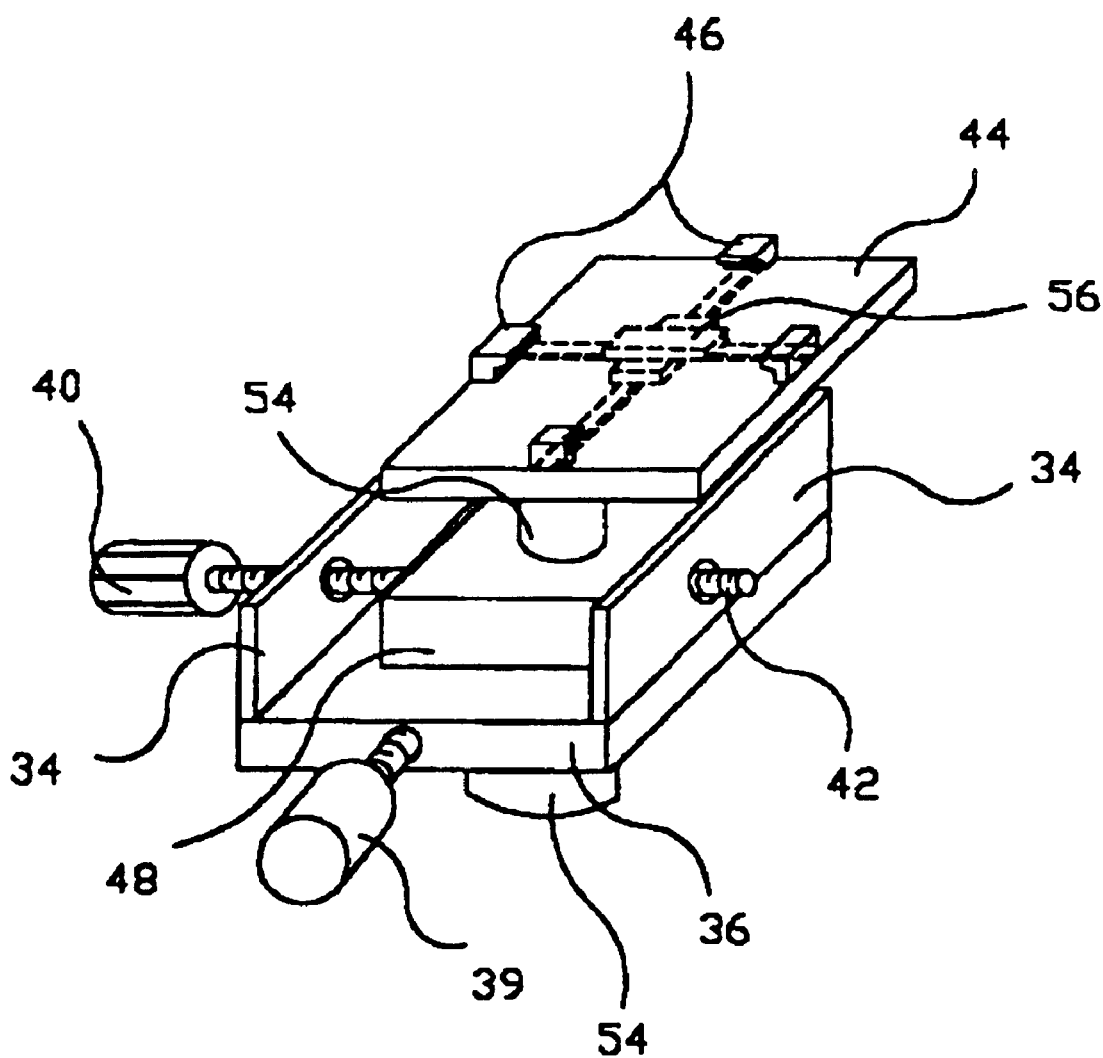
FIG. 6 is a perspective view showing a transferring unit for transferring the PCBs.
Figure 7:
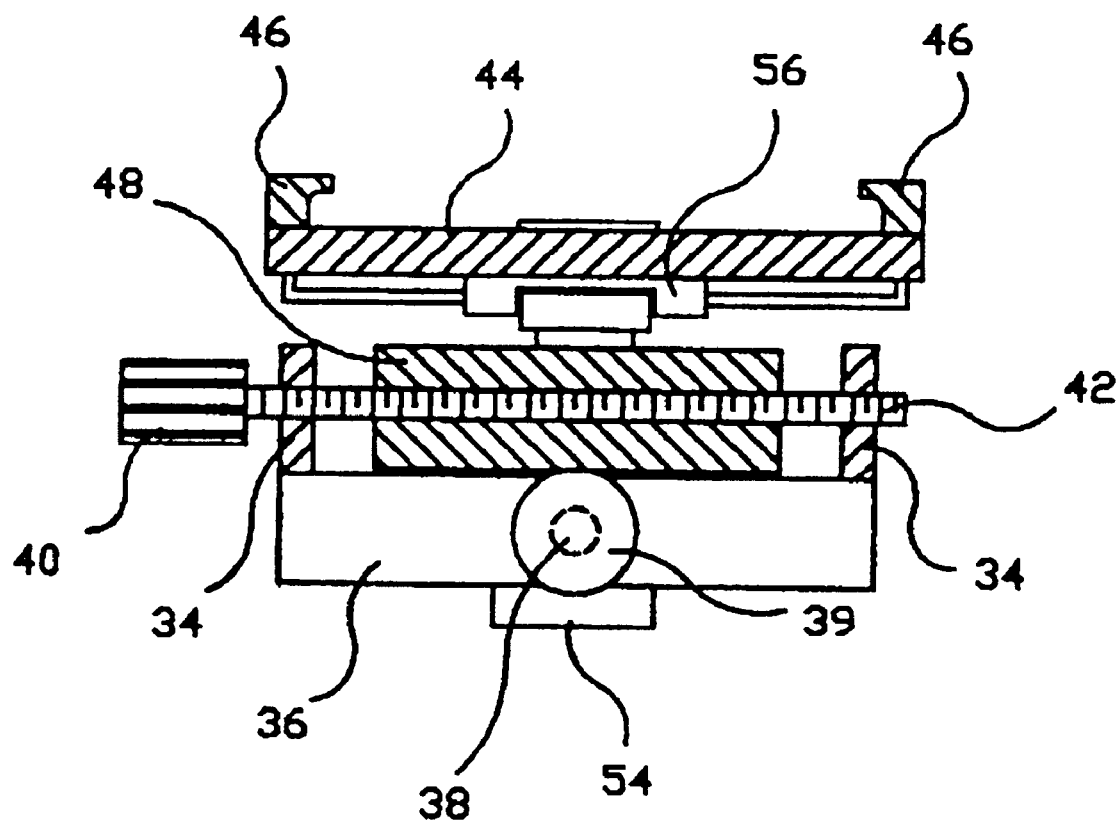
FIG. 7 is a sectional view of FIG. 5.

FIG. 4 is a perspective view showing a structure of a surface mounter according to the present invention, FIG. 5 is a schematical perspective view showing a plurality of transferring units by which PCBs are supplied, and pickers, FIG. 6 is a perspective view showing a transferring unit for transferring the PCBs, and FIG. 7 is a sectional view of FIG. 5.

At first, a general consideration will be made for the PCB transferring apparatus of the surface mounter in accordance with the present invention.

The PCB transferring apparatus is comprised of: a frame 10; an X-Y gantry 18 provided on an upper portion of the frame 10, the X-Y gantry 18 being moved an the X-Y axes; a base 12 disposed on the frame 10 and placed inside the X-Y gantry 18; a sensing unit 20 installed on an upper portion of the base 12, and for sensing the PCB 1 fed from an inlet 22 to determine the position thereof; a PCB transferring unit 32 for freely moving the sensed PCB 1 on the base 12; and at lease one or more pickup head units 30 installed in the X-Y gantry 18, and for mounting the electronic components on the PCB 1 having been transferred by the PCB transferring unit 32; wherein the PCB transferring unit 32 comprises: a moving axis 54 along which the base 12 is free to be moved; a first base 36 provided on an upper portion of the moving axis 54; a second base 48 provided on an upper portion of the first base 36; a PCB supporting plate 44 installed on an upper portion of the first base 36, and having a clamping element 46 for firmly holding the PCB 1; said clamping element 46 disposed on the second base 48 and below a PCB supporting plate 44, used for griping the PCB 1; a power transmission unit for moving the first and second bases 38, 48 along the X and Y axes; and an actuator 56 acting on the clamping element 46; wherein the PCB transferring unit 32 is constituted to have one or more degrees of freedom such that the PCB transferring unit is free to be moved on the base 12 and is positioned at arbitrary positions; wherein the power transmission unit comprises: a first ball screw 38 passing through the first base 36 and being rotated by a driving motor 39, by which the first base 36 can be free to move along the Y-axis; and a second ball screw 42 passing through the second base 48 and being rotated by a driving motor 40, by which the second base 48 can be free to move along the X-axis; and wherein the pickup head unit 30 is installed in the X-Y gantry 18 and has two or more degrees of freedom such that movements of the pickup head unit along the Z axis and R axis are made possible in order to be able to mount the electronic components on the PCB transferred by the PCB 1 transferring unit 32.

The detailed structure of the PCB transferring apparatus according to the present invention will be described below.

At first, on both upper sides of the frame 10, there are provided opposing Y-axis gantries 14. An X-axis gantry 16 is installed bridging between the Y-axis gantries 14. A pickup head unit 30 is installed on the X-axis gantry 16. An installation of the X-axis gantry installed with respect to the Y-axis gantry 14 is such that the X-axis gantry is horizontally moved in an X-axis direction. Also, at least one or more pickup head units 30 installed on one side of the X-axis gantry is operated to pick up or mount the electronic components, while the pickup head unit 30 is moved up and down or rotated.

The pickup head unit 30 consists of a mounter head 26 and a picker 28 having a nozzle section (not shown). When the PCB 1 arrives, the picker 28 rotates on a R-axis and then moves upward along a normal Z-axis to mount the electronic components.

On the upper side of the frame 10, there is also provided a base 12 on which at least one or more PCB transferring units 32 may be moved, the PCB transferring unit 32 being operated to transfer the PCB 1 supplied through an inlet 22.

The sensing unit 20 is installed on the Y-axis gantry 14 and the inlet 22 through which the PCB 1 is supplied, and is operated to measure the position of the PCB 1 being fed and an orientation thereof. Below the sensing unit 20, there is disposed a controller 52 electrically connected to the sensing unit 20 and which functions to calculate a moving distance using a position data associated with the PCB 1 measured from the sensing unit 20 and control the transfer of the PCB 1.

A plurality of PCB transferring units 32 each being constructed as described above are provided in a restricted area within which the PCB transferring units 32 are free to move on the base 12. As shown in FIG. 5, one or more pieces of the X-Y gantry 18 and picking heads units 30 are installed. The provision of such plural elements makes it possible to perform various works at arbitrarily locations when the PCBs 1 are supplied and to provide cooperative combinations of the X-Y gantry 18 and plural picking head units 30. Such configuration also provides prompt operations by the sensing of relative positions between the X-Y gantry 18 and PCB transferring unit 32 and between the PCB transferring 32 and the picking head unit 30, or by the controlling of such elements.

FIG. 6 is a perspective of the PCB transferring unit according to the present invention, and FIG. 7 is a sectional view of FIG. 7.

The PCB transferring unit 32 used for transferring the PCB 1 is comprised of a first base 36, a second base 48 disposed on an upper portion of the first base 36, a moving axis 54 vertically provided such that both the first and second bases 36, 48 can be moved, and a clamping element 46 disposed above an upper portion of the moving axis 34 and for supporting and clamping the PCB 1.

Moreover, to move both the first and second bases 36, 48 along the X- and Y-axes, there is provided a power transmission unit having a first screw 38 and a second screw 42. With the first screw 38 passing through the first base 36 and being rotated by a driving motor 39, the first base 36 can be free to move along the Y-axis, and the second base 48 can be free to move along the X-axis by the aid of the second screw 42 passing through the second base 48 and being rotated by the driving motor 40.

Herein, for the transmission of the power, the method using the motor as the driving source and the pulley coupled thereto by the belt may be used. Alternatively, another method using the motor and a ball screw may be employed in stead, as used in the present invention. Also, as still another embodiment, a linear motor may be used for giving a desired movement along the X- and Y-axes. Further, as another driving source, a surface motor may be also used.

Moreover, there is provided a first ball screw 38 used for moving the first base 36 along the Y-axis, the first ball screw 38 having one end thereof to which the driving motor 38 is coupled. Also, on both sides of upper side of the first base 36, there are provided opposing fixed brackets 34 in which the second base 48 is placed therebetween.

Further, there is provided a second ball screw 42 passing through both the fixed brackets 34 and the second base 48, the second ball screw 42 having one end thereof to which the motor 40 is coupled.

The first and second ball screws 38, 42, respectively, passing through the first and second bases 36, 48 are rotated by respective motors 39, 40, by which the first and second bases 36, 48 are moved, respectively, along the X and Y axes.

The clamping elements 46 disposed on a PCB supporting plate 44 are used to firmly hold the PCB 1. Each of the clamping elements 46 is designed to be moved back and forth, whereby the clamping elements 46 can grip the PCB 1. Specifically, such an movement of the clamping elements 46 for firmly griping the PCB 1 can be made by an actuator 56 disposed below the PCB supporting plate 44.

The clamping elements 46 may consist of at least three or more elements, and at least one or more linear motors can be used as actuators each being used for driving each clamping element 46. Alternatively, one or more surface motors can be used, or one or more cylinders can be also used.

Thus, the PCB transferring unit 32 as described above is moved along the moving axis 54 and gives a rotational angle, by which the deviation angle occurring in mounting the electronic components on the PCB can be compensated. Further, at least two or more degrees of freedom can be given which makes it possible an accurate mounting of the electronic components and an improved productivity.

According to the foregoing, the present invention enables to accurately control the positions where the electronic components are to be mounted on the PCB, as well as to make it possible the work at arbitrary positions. Further, as for any errors possibly occurring in mounting the electronic components, easy compensation therefor can be made. Also, with two or more degrees of freedom given to the PCB transferring unit, by which an accurate mounting of the electronic components is made possible, reliability of the products can be further improved.

What is claimed is:

1. A printed circuit board (PCB) transferring apparatus for a surface mounter for mounting electronic components on a PCB, comprising:

a frame;

an X-Y gantry mounted on an upper portion of the frame, wherein the X-Y gantry can move in the X and Y directions;

a base mounted on the frame and under the X-Y gantry; and a plurality of PCB transferring units coupled to the base, wherein each PCB transferring unit is configured to hold a PCB, wherein each PCB transferring unit is configured to move a held PCB in both X and Y directions relative to the base, and wherein the plurality of PCB transferring units can simultaneously hold a corresponding plurality of PCBs at different positions on the base that are reachable by the X-Y gantry.

2. The apparatus of claim 1, further comprising a sensing unit configured to sense a position of a PCB mounted on one of the plurality of PCB transferring units.

3. The apparatus of claim 1, further comprising a pickup head mounted on the X-Y gantry, wherein the pickup head comprises at least one suction nozzle configured to pick up and place an electronic component.

4. The apparatus of claim 3, wherein the at least one suction nozzle can be rotated around a longitudinal axis, and moved in the Z direction.

5. The apparatus of claim 1, wherein each of the plurality of PCB transferring units comprises:

a moving axis configured to be movable along the base;

a first base mounted on the moving axis and configured to be movable in a first direction relative to the moving axis; and a second base mounted on the first base and configured to be movable in a second direction relative to the moving axis.

6. The apparatus of claim 5, wherein each of the plurality of PCB transferring units further comprises:

a first actuator configured to move the first base in the first direction relative to the moving axis; and a second actuator configured to move the second base in the second direction relative to the moving axis.

7. The apparatus of claim 1, wherein each of the plurality of PCB transferring units comprises:

a clamping mechanism configured to grasp four sides of a PCB to securely hold the PCB; and an actuator configured to move the clamping mechanism between open and closed positions.

8. The apparatus of claim 7, wherein the actuator comprises at least one linear motor.

9. The apparatus of claim 7, wherein the actuator comprises at least one motor.

10. The apparatus of claim 7, wherein the actuator comprises at least one piston and cylinder.

11. A printed circuit board (PCB) transferring apparatus for a surface mounter for mounting electronic components on a PCB, comprising:

a frame;

an X-Y gantry mounted on an upper portion of the frame, wherein the X-Y gantry can move in the X and Y directions;

a base mounted on the frame and under the X-Y gantry; and at least one PCB transferring unit coupled to the base, wherein the at least one PCB transferring unit is configured to hold a PCB, wherein the at least one PCB transferring unit is configured to move a held PCB in both X and Y directions relative to the base to a plurality of different positions on the base that are reachable by the X-Y gantry, and wherein the PCB transferring unit comprises:

first and second opposed jaws that are configured to move toward and away from each other along a first axis to grip first and second opposed edges of a PCB, and third and fourth jaws that are configured to move toward and away from each other along a second axis to grip third and fourth opposed edges of a PCB.

12. The apparatus of claim 11, wherein the at least one PCB transferring unit comprises a plurality of PCB transferring units, and wherein the plurality of PCB transferring units are configured to simultaneously hold a corresponding plurality of PCBs at different positions on the base that are reachable by the X-Y gantry.

13. The apparatus of claim 11, wherein the at least one PCB transferring unit further comprises an actuator mechanism configured to move the first and second jaws toward and away from each other, and the third and fourth jaws toward and away from each other.

14. The apparatus of claim 13, wherein the actuator mechanism comprises at least one linear motor.

15. The apparatus of claim 13, wherein the actuator mechanism comprises at least one motor.

16. The apparatus of claim 13, wherein the actuator mechanism comprises at least one piston and cylinder.

17. The apparatus of claim 11, further comprising a sensing unit configured to sense a position of a PCB mounted on the at least one PCB transferring unit.

18. The apparatus of claim 11, wherein the at least one PCB transferring unit comprises:

a moving axis configured to be movable along the base;

a first base mounted on the moving axis and configured to be movable in a first direction relative to the moving axis; and a second base mounted on the first base and configured to be movable in a second direction relative to the moving axis.

19. The apparatus of claim 18, wherein the at least one PCB transferring unit further comprises:

a first actuator configured to move the first base in the first direction relative to the moving axis; and a second actuator configured to move the second base in the second direction relative to the moving axis.

* * * * *